United States Patent [19]

Wang et al.

[11] Patent Number: 5,663,665

[45] Date of Patent: Sep. 2, 1997

[54] MEANS FOR CONTROL LIMITS FOR DELAY LOCKED LOOP

[75] Inventors: Yun-Che Wang, Los Altos; Gaurang Shah, Sunnyvale, both of Calif.

[73] Assignee: Cypress Semiconductor Corp., San Jose, Calif.

[21] Appl. No.: 564,597

[22] Filed: Nov. 29, 1995

[51] Int. Cl.$^6$ .................................................. H03K 5/159
[52] U.S. Cl. .................... 327/3; 327/2; 327/148; 327/149; 327/157; 327/158; 327/276; 327/261
[58] Field of Search ................................. 327/1, 2, 3, 7, 327/8, 141, 147, 148, 149, 150, 250, 152, 153, 156, 157, 158, 159, 244, 161, 276, 231, 261, 269, 270

[56] References Cited

U.S. PATENT DOCUMENTS 4,855,683  8/1989  Trouder et al. ..................... 327/159
5,120,990  6/1992  Koker ..................................... 327/2

OTHER PUBLICATIONS

Mark G. Johnson and Edwin L. Hudson, A Variable Delay Line PLL for CPU–Coprocessor Synchronization, Oct., 1988, IEEE Journal of Solid-State Circuits, vol. 23, No. 5.

Mel Bazes and Roni Ashuri, A Novel CMOS Digital Clock and Data Decoder, Dec., 1992, IEEE Journal of Solid-State Circuits, vol. 27, No. 12.

*Primary Examiner*—Timothy P. Callahan
*Assistant Examiner*—Dinh T. Le
*Attorney, Agent, or Firm*—Bliss McGlynn, P.C.

[57] ABSTRACT

A delay lock loop having an improved delay element which results in a two-fold improvement in the operation of the delay lock loop. Firstly, it guarantees that the phase detector portion of the delay lock loop will yield the correct phase differential. Secondly, it eliminates the possibility of a harmonic lock condition from occurring.

9 Claims, 4 Drawing Sheets

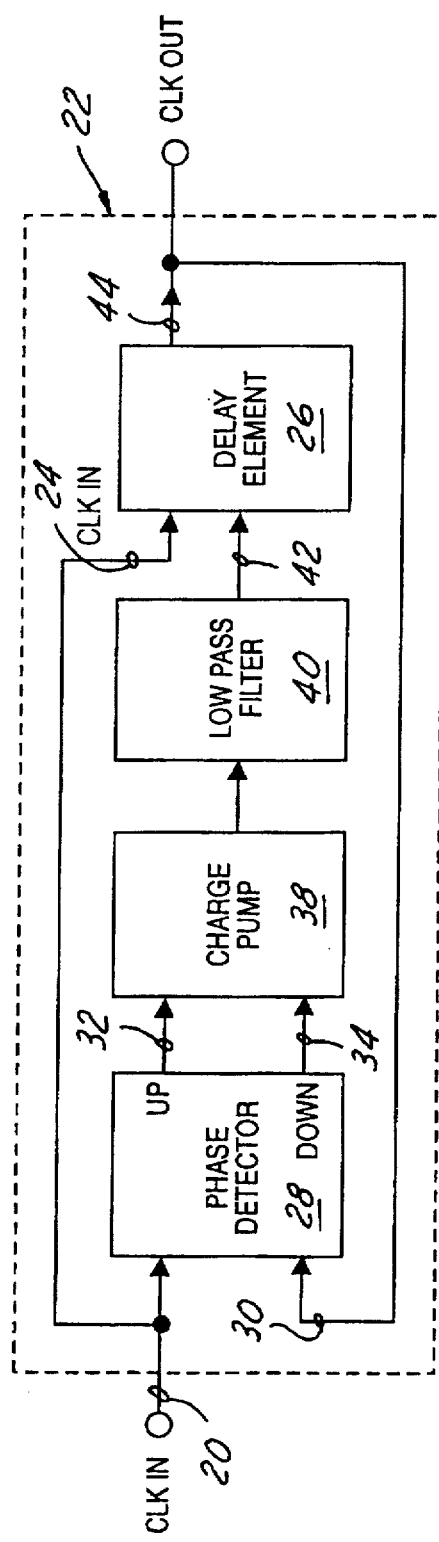
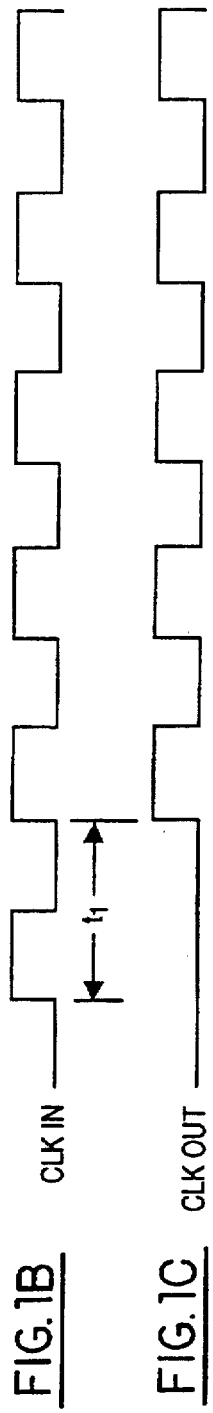
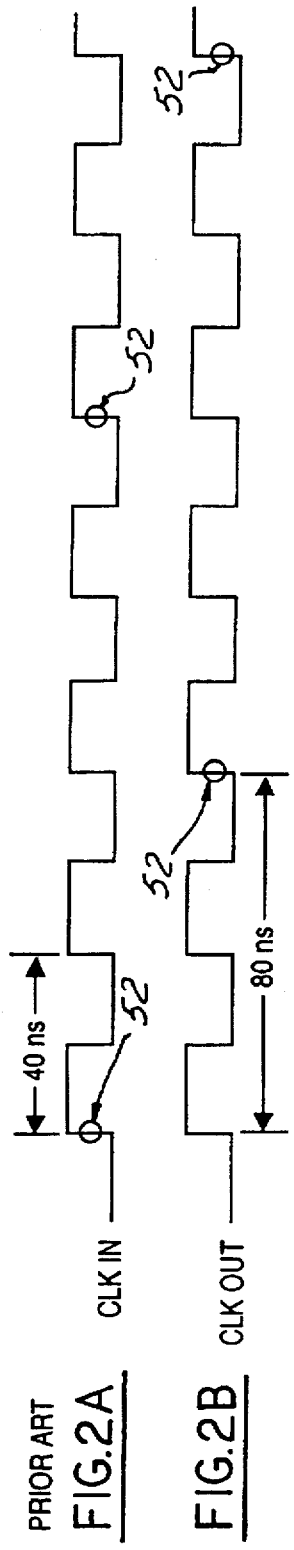
FIG.1A PRIOR ART
FIG.1B CLK IN
FIG.1C CLK OUT
FIG.2A PRIOR ART CLK IN
FIG.2B CLK OUT

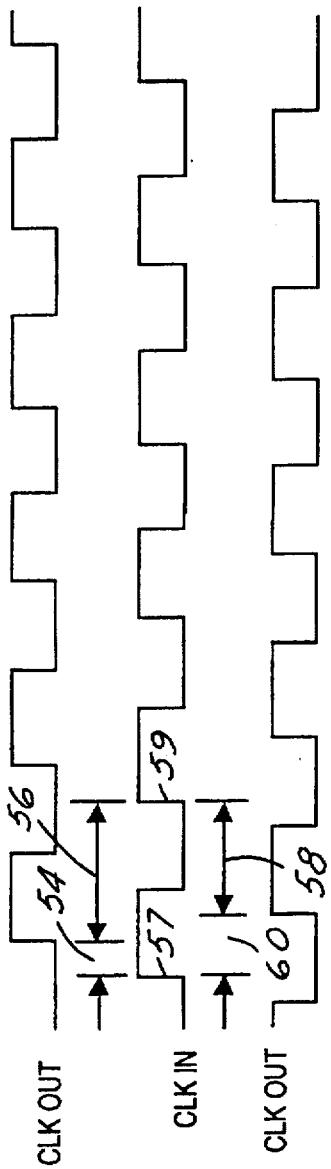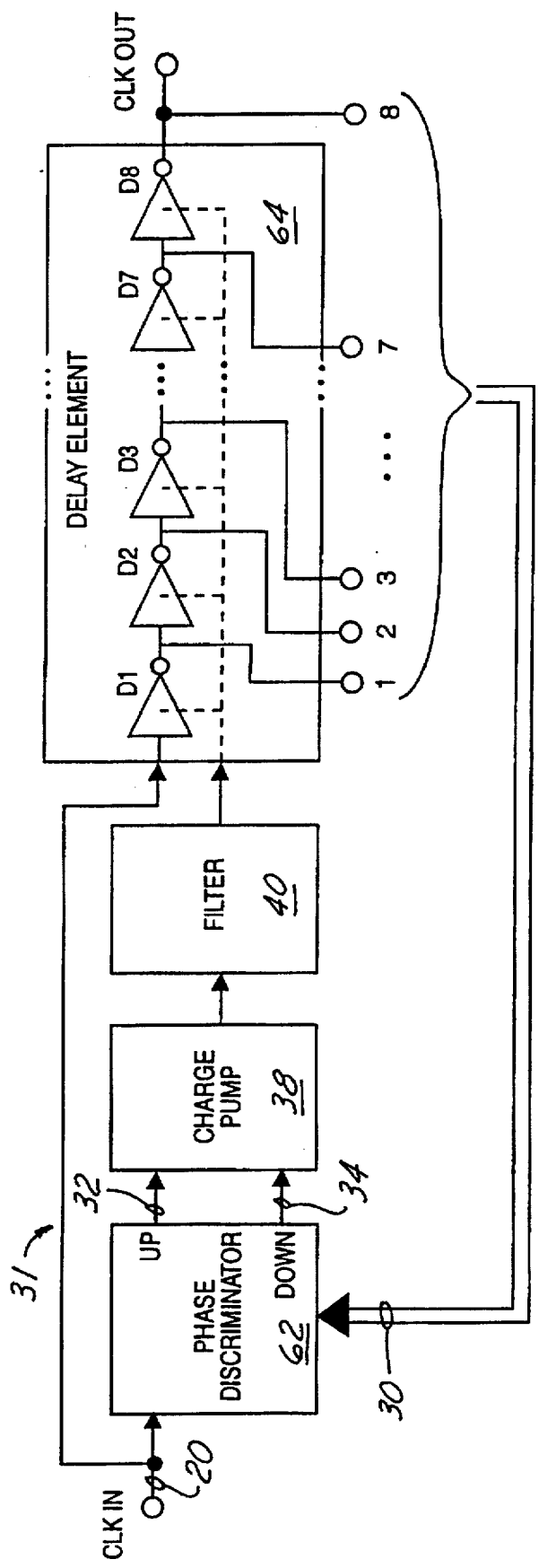

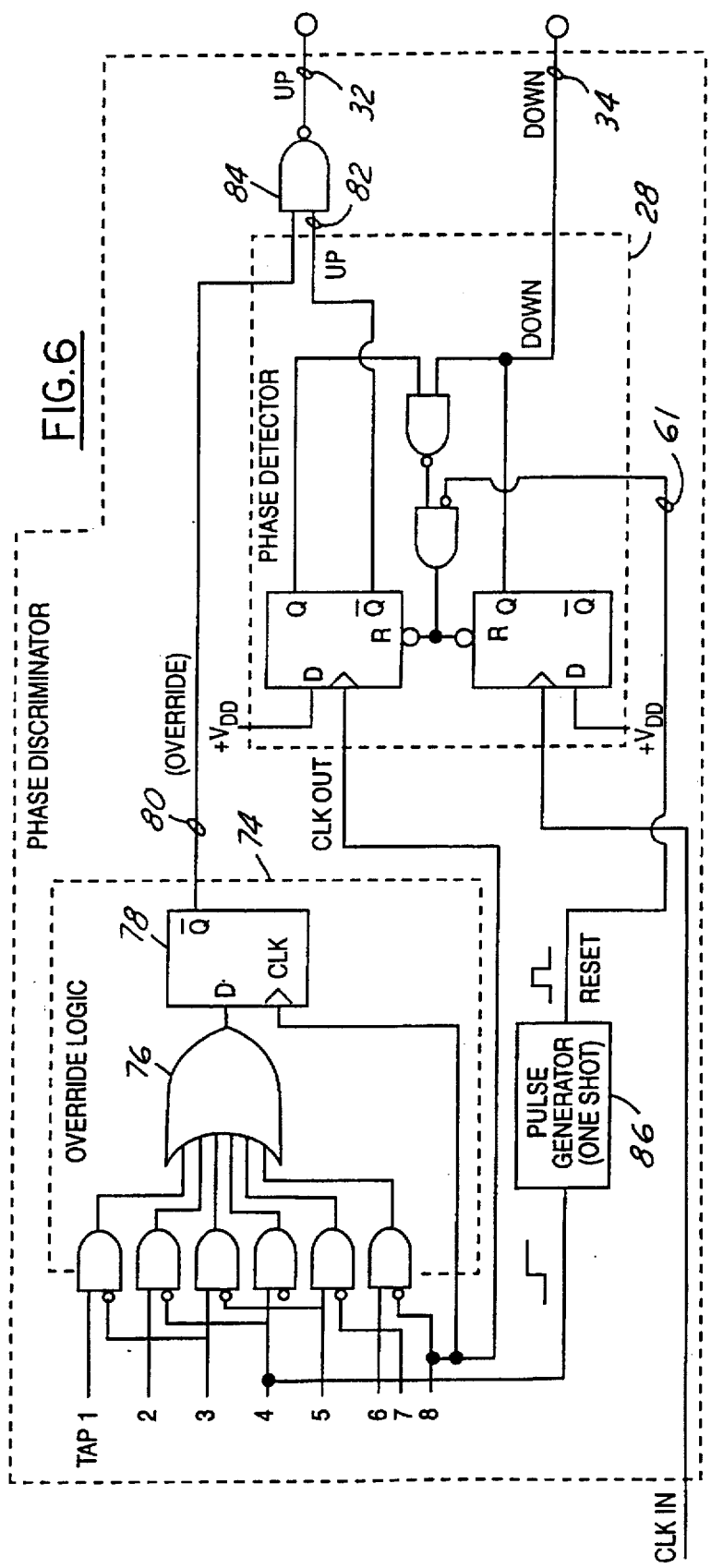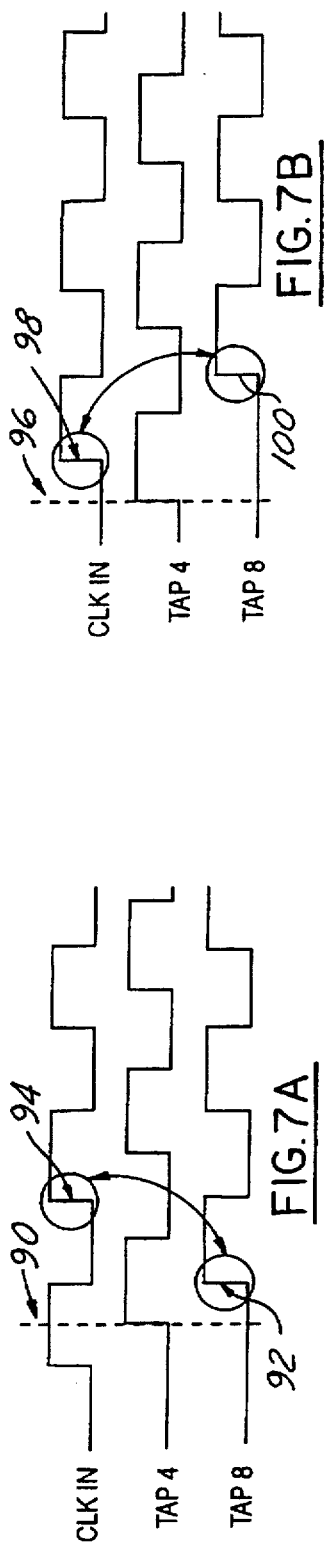

MEANS FOR CONTROL LIMITS FOR DELAY LOCKED LOOP

TECHNICAL FIELD

This invention relates to delay locked loop circuits and more particularly relates to delay locked loops having improved controls for providing enhanced performance.

BACKGROUND OF THE INVENTION

Delay locked loops (DLL) are commonly used for generating timing reference signals used in electronic circuits. A typical delay locked loop is configured as shown in FIGS. 1A–1C, and functions generally as follows.

Now referring to FIGS. 1A–1C, an input signal denoted as CLK IN is placed on input line 20 of delay lock loop 22. The CLK IN signal is also applied to line 24 which is the input to delay element 26. Phase detector 28 functions to compare the phase difference between the signals present on lines 20 and 30 and generate an output on lines 32 and 34 representative of the phase difference between the signals present on lines 20 and 30. For example, if the signal present on line 20 leads the signal on line 30, a signal is present on line 32 commanding charge pump 38 to drive the voltage on line 36 higher. Likewise, if the signal on line 30 leads the signal on line 20, a signal is present on line 34 to command charge pump 38 to lower the voltage present on output line 36. The output voltage 36 is passed to low pass filter 40 where it is filtered and delivered to delay element 26 along line 42. Delay element 26 functions to delay the signal present on line 24 in proportion to the voltage present on line 42. This delayed signal is placed on output line 44 and is fed back along line 30 into phase detector 28.

FIG. 1B shows a hypothetical signal which is placed on line 20 (and also placed into delay element 26 by virtue of line 24). After a certain transient period, delay element 26 will be responsible for time delaying the signal on line 24 by the time increment $t_1$. This time delayed signal (see FIG. 1C) is placed on line 44 where it is fed back to phase detector 28 along line 30. Because signals represented in FIGS. 1B and 1C are in phase, the output of phase detector 28 is null and charge pump 38 neither increases or decreases its voltage on output line 36. Thus, delay element 26, under these conditions, maintains whatever delay it is introducing ($t_1$) and the delay lock loop is successful in locking the output signal (CLK OUT) in phase with the input signal (CLK IN).

If during the operation of the delay lock loop of FIG. 1A, there develops a phase difference between CLK IN signal and CLK OUT signal, this will result in a phase error detected by phase detector 28 which results in a command to charge pump 38 to generate a voltage on line 36 which tends to drive delay element 26 in a direction which causes a phase delay in the signal present on output line 44 to lessen the phase difference between the signal present on CLK IN and the CLK OUT signal. Thus, it has been demonstrated that the delay lock loop of FIG. 1A tends to correct any phase error which exists between the CLK IN signal and the CLK OUT signal.

Although the operation of the typical prior art delay lock loop can generally be described as has been set forth above, there are certain drawbacks with delay lock loops when they are designed without upper and lower control limits on the amount of delay entered by delay element 26. Two articles published in the IEEE JOURNAL OF SOLID-STATE CIRCUITS address this problem and set forth solutions for controlling the absolute limits of the delay element (see IEEE JOURNAL OF SOLID-STATE CIRCUITS, VOL. 27, NO. 12, DEC. 1992 and VOL. 23, NO. 5, October 1988). Although, such attempts to limit the control limits of the delay line may be successful, they are specific to their particular implementation of the delay element and none of them are generic or easily expandable to alternative implementations of delay elements.

It is well understood that if upper and lower limits are not placed on the time delay introduced by the delay element 26, two types of erroneous modes of operation can occur— harmonic lock or ambiguity in detecting the correct phase error (hereinafter phase ambiguity). These two erroneous modes of operation will now be explained.

Now referring to FIGS. 1A, 2A and 2B, harmonic lock occurs when the delay element 26 is introducing a large delay into the CLK OUT signal but the resultant delay is such that the output signal generated by delay element 26 has a period which is an integer multiple of the period of the CLK IN signal. Under these conditions, phase detector 28 of delay lock loop 22 will not detect a phase error between the signals present on lines 20 and 30 and therefore it cannot differentiate the correct running of the delay locked loop from the incorrect operation of the delay lock loop. For example (see FIGS. 2A and 2B) if the incoming signal has a period of 40 ns and the delay element starts up at an 80 ns delay increment, the phase detector will observe one rising clock edge 52 exiting delay element 26 every 40 ns which satisfies the criteria for a locked condition. Thus, in this case, the delay lock loop will be "fooled" into locking into an 80 ns pulse delay when in fact it should be locking into a 40 ns pulse delay.

The second error condition, phase ambiguity, will be explained in conjunction with FIGS. 1A, and 3A–3C. It is critical to the correct operation of the phase detector 28 that it be capable of determining whether the phase error is positive or negative (i.e. whether the CLK IN signal leads or lags the CLK OUT signal). If the phase detector enters into a mode whereby it cannot correctly decipher between the two conditions, the phase detector will generate erroneous phase information. Thus, as is illustrated in FIGS. 3A and 3B, the phase difference between the CLK OUT signal and the CLK IN signal is either the phase delay indicated at 54 or the phase advance indicated at 56 depending upon which rising edge 57, 59 is used as the reference point. Likewise, in comparing the signal of FIG. 3B with the signal of FIG. 3C the resulting phase delay between the two signals can either be the phase advance indicated at 58 or the phase delay indicated at 60 depending upon which rising edge 57, 59 is used as the reference point.

The present invention sets forth a system for eliminating harmonic lock and phase ambiguity.

Thus it is an object of this invention to provide a delayed-lock loop which controls the absolute limit of its delay element in a way which allows the delay lock loop to offer superior operation to that of the known prior art delay lock loops and also in a way which is not limited to particular implementations of delay elements but are generic and easily expandable to any type of delay element.

Also, it is an object of this invention to provide a circuit for controlling the upper limit of the delay line such that the delay lock loop cannot enter into a harmonic lock condition when it is running at an integer multiple of the reference signal.

SUMMARY OF THE INVENTION

The delay lock loop of the present invention includes a charge pump, a low pass filter coupled to the charge pump, a delay element having an input coupled to the low pass filter and an output. The delay element further includes a plurality of delay taps intermediate the input and output of the delay element. Also included is a phase discriminator which includes an override logic circuit. The phase discriminator is connected to the output of the delay element and is also connected to at least one of the intermediate taps.

In a preferred embodiment, the phase discriminator further includes a phase detector wherein the override logic circuit is coupled to the output of the delay element and also coupled to at least one of the intermediate taps. The override logic circuit is preferably coupled to the phase detector and is effective for forcing an output signal of the phase detector into a predetermined state whenever the signal present on at least one of the intermediate taps changes state coincidentally with a change of state on the signal present on the output of the delay element.

In a preferred embodiment, the override logic circuit includes a logical OR gate and a D flip flop wherein the output of the logical OR gate is coupled with the D terminal of the D flip flop.

A second aspect of the present invention includes a delay lock loop circuit including a charge pump, a low pass filter coupled to the charge pump, a delay element having an input coupled to the low pass filter and an output. The delay element also includes a plurality of delay taps intermediate the input and output of the delay element. Also included is a phase discriminator including a pulse generator circuit wherein the pulse generator circuit is connected to at least one of the intermediate taps.

Preferably, the phase discriminator includes a phase detector wherein the pulse generator is coupled to at least one of said intermediate taps, whereby the pulse generator generates a reset pulse to reset the phase detector whenever the signal present on at least one of said intermediate taps undergoes a predetermined transition.

Preferably, the phase detector includes at least two flip flops or RS latchers and wherein the reset pulse of the phase generator is connected to said flip flop or RS latcher for forcing said flip flops or RS latchers to a predetermined state.

BRIEF DESCRIPTION OF THE DRAWINGS

FIGS. 1A-1C show a prior art delay lock loop and its associated timing diagrams.

FIGS. 2A and 2B show the timing diagrams for the delay locked loop of FIG. 1 when it is in a harmonic lock condition.

FIGS. 3A-3C demonstrate the problems associated with phase ambiguity is present.

FIG. 4 shows the delay locked loop of the present invention implementing an intermediate taps on the delay line to reset the phase discriminator and employing improved phase discriminator logic which examines the content of at least one of the taps to detect if conditions for harmonic lock are present.

FIG. 6 shows a detailed circuit of the phase discriminator portion of the delay locked loop of the present invention.

FIGS. 7A and 7B show timing diagrams for leading and lagging delay line signals respectively.

DETAILED DESCRIPTION OF THE PREFERRED EMBODIMENT

Figure 5A:
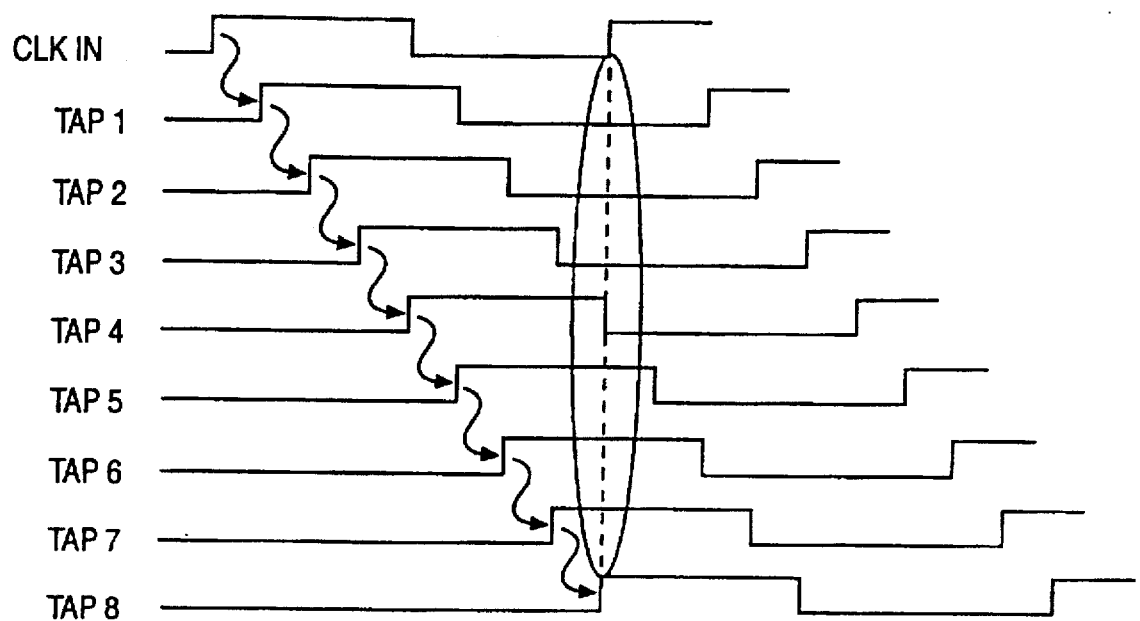
FIGS. 5A and 5B are timing diagrams depicting non-harmonic lock and harmonic lock conditions respectively.

Now referring to FIG. 4, the delay lock loop 31 of the present invention includes charge pump 38 and filter 40 having a conventional design and functioning as has already been discussed. The novelty of the delay lock loop of the present invention is found in delay element 64, phase discriminator 62 and the interaction of these two circuits with charge pump 38 and filter 40. We will now show how the delay lock loop of the present invention overcomes the harmonic lock problem discussed previously. Thereafter, we will show how the delay lock loop of the present invention overcomes the phase ambiguity problem already discussed.

Harmonic Lock

Figure 5B:
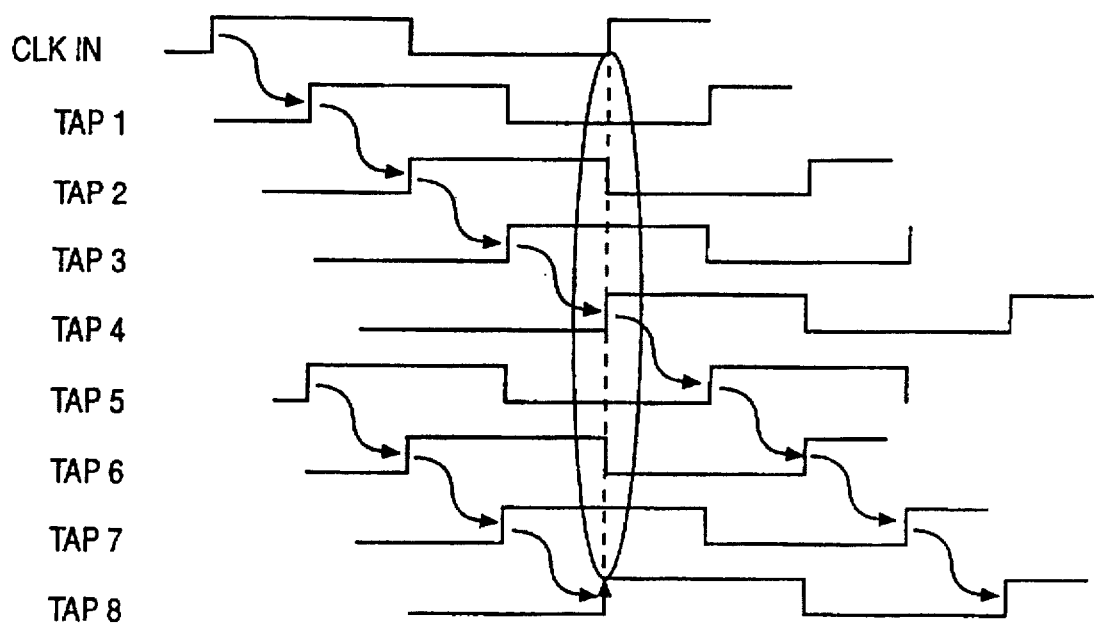

Now referring to FIGS. 2A, 2B, 4, 5A, and 5B, as has already been discussed, harmonic lock cannot be detected by simply comparing rising edges between the CLOCK IN Signal and the CLOCK OUT signal using the traditional phase detector. However, if delay element 64 is provided with a number of intermediate delay taps (D1-D8), the existence of a harmonic lock condition can be detected and eliminated using the following technique. As shown in FIG. 5A, if no harmonic lock condition exists, there will be no rising edges (from taps 1-8) 66 concurrent with a rising edge 68 present on tap 8. Thus, by looking at the signals present on the intermediate taps, concurrent with rising edge 68 of the signal present on tap 8, we can determine if a harmonic condition exists. Thus, as indicated in FIG. 5B, rising edge 72 of tap 4 occurs concurrently with rising edge 70 of tap 8, thus, we know that in this case, a harmonic lock condition exists.

Now referring to FIG. 4, 5 and 6, phase discriminator 62 employs override logic 74 which senses harmonic lock and controls phase detector 28 in a way which eliminates the harmonic lock condition. Accordingly, override logic circuit 74 employs AND-OR gate 75, 76 and D flip flop 78. The D terminal on D flip flop 78 is tied to the output of AND-OR gate 75, 76. The clock input to D flip flop 78 is tied to tap 8. When a rising edge exists on tap 8, a concurrent rising edge on any one of the taps 1-7 generate an override signal on line 80.

If an override signal is present on line 80, the output 32 of NAND gate 84 will stay high regardless of the signal on line 82, thereby causing the charge pump 38 to continuously charge upward until the delay element speeds up sufficiently to bring the delay lock loop out of a harmonic lock mode.

Phase Ambiguity

As was discussed in conjunction with FIGS. 3A-3C, it is imperative that the proper reference be established for phase detector 28 in order to determine the proper phase relationship between the CLK IN signal and the CLK OUT signal. In order to achieve this, it is important to note that a basic characteristic of any delay line is that its output always lags its input (because any realizable delay must take some finite amount of time). Accordingly, if the phase detector 28 is synchronized (or cleared) in a predictable way that is related to the actual sequence of the CLK IN signal with respect to the CLK OUT signal, then it will compare the CLK IN signal with the CLK OUT signal without ambiguity. This technique is graphically depicted in FIGS. 7A and 7B. FIG. 7A shows that in the case where the delay line is running too fast, phase detector 28 will be reset (line 61) by pulse generator 86 at the rising edge 90 of the signal present on tap 4. Thereafter, phase detector 28 will compare rising edge 92 of the signal present on tap 8 with rising edge 94 of the signal present on the CLOCK IN line. In cases where the delay line is running too slow, the rising edge 96 of tap 4 will reset phase detector 28. Thereafter, the rising edge of CLOCK IN pulse 98 will be compared with the rising edge 100 of the signal present on tap 8.

It is important to note that a critical part of this aspect of the present invention is that the use of the intermediate delay line guarantees to reset phase detector 28 before the output of the delay line arrives at phase detector 28. For example, if the midpoint of the delay line is used to reset phase detector 28, then the reset always occurs at 0.5 of the total delay time (0.5 $D_{delay}$ after the reference clock, which is also the input to the delay line, and 0.5 $D_{delay}$ before the output of the delay line). The only consideration that must be given when choosing the tap is that, under maximum delay, phase detector 28 is always reset prior to the next CLOCK IN signal (i.e. X% of the max delay must be less than reference clock period). For example, if CLOCK IN period is 40 ns and delay element 64 has a maximum delay of 120 ns, then the reset tap should come from one of the taps which is less than or equal to ⅓ of the delay line.

The foregoing detailed description shows that the preferred embodiments of the present invention are well suited to fulfill the objects of the invention. It is recognized that those skilled in the art may make various modifications or additions to the preferred embodiments chosen here to illustrate the present invention, without departing from the spirit of the present invention. Accordingly, it is to be understood that the subject matter sought to be afforded protection hereby should be deemed to extend to the subject matter defined in the appended claims, including all fair equivalents thereof.

We claim:

1. A delay lock loop circuit, comprising:

a charge pump having: (i) an input and (ii) an output, a low pass filler having: (i) an input coupled to said output of said charge pump and (ii) an output, a delay element having: (i) an input coupled to said low pass filter and (ii) an output for presenting an output clock, said delay element further including a plurality of delay taps intermediate said input and output of said delay element, and a phase discriminator including (i) an input for receiving an input clock, (ii) an override logic circuit having (a) a first input connected to said output of said delay element and (b) a second input coupled to at least one of said plurality of delay taps, and (iii) an output coupled to said input of said charge pump.

2. The circuit of claim 1, wherein said phase discriminator further includes a phase detector, and wherein said override logic circuit is coupled to said phase detector, whereby said override logic circuit forces an output signal of said phase detector into a predetermined state whenever the signal present on said at least one of said plurality of delay taps changes state coincidentally with a change of state of the signal present on the output of said delay element.

3. The circuit of claim 2, wherein said override logic circuit includes a logical AND gate and a D flip flop, wherein the output of the logical AND gate is coupled to the D terminal of the D flip flop.

4. The circuit according to claim 1, wherein said override logic includes a logical OR gate and a D flip flop, wherein the output of the logical OR gate is coupled to the D terminal of the D flip flop.

5. A delay lock loop circuit comprising:

a charge pump having: (i) an input and (ii) an output, a low pass filter having: (i) an input coupled to said output of said charge pump and (ii) an output, a delay element having: (i) an input coupled to said low pass filter and (ii) an output for presenting an output clock, said delay element further including a plurality of delay taps intermediate said input and output of said delay element, and a phase discriminator including:
   (i) an input for receiving an input clock,
   (ii) a pulse generator circuit having an input connected to at least one of said plurality of delay taps, and
   (iii) an output coupled to said input of said charge pump.

6. The circuit of claim 5, wherein the phase discriminator includes a phase detector, wherein said pulse generator is coupled to a least one of said plurality of delay taps, whereby said pulse generator resets the phase detector whenever the signal present on said at least one of said plurality of delay taps undergoes a predetermined transition.

7. The circuit of claim 6, wherein said phase detector includes at least two flip flops, wherein said reset pulse of said pulse generator is connected to said flip flops for forcing said flip flops to a predetermined state.

8. The circuit according to claim 6, wherein said phase detector includes at least two latches, wherein said reset pulse of said pulse generator is connected to said latches for forcing said latches to a predetermined state.

9. A delay lock loop, comprising:

a charge pump having: (i) an input and (ii) an output, a low pass filter having: (i) an input coupled to said output of said charge pump and (ii) an output, a delay element coupled to said low pass filter wherein said delay element includes an input terminal, an output terminal and a plurality of tap terminals, whereby said delay element (a) receives an input signal at said input terminal and(b) produces a phase delayed signal on said output terminal and (c) produces tap signals on said plurality of taps, whereby said tap signals are phase delayed with respect to each other and are intermediate to phase delay introduced in said phase delayed signal present on said output terminal, and a phase discriminator having an input for receiving an input clock and an output coupled to said input of said charge pump, said phase discriminator including;

a phase detector having: (i) a first input coupled to said input of said phase discriminator, (ii) a second input coupled to said output terminal of said delay element and (iii) a third input coupled to said at least one of said plurality of tap terminals via means for resetting.

* * * * *